(12) United States Patent
Gong et al.

(10) Patent No.: US 8,740,560 B2
(45) Date of Patent: Jun. 3, 2014

(54) FAN MODULE

(75) Inventors: Xin-Hu Gong, Shenzhen (CN);
Gao-Liang Xia, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 506 days.

(21) Appl. No.: 13/082,339

(22) Filed: Apr. 7, 2011

(65) Prior Publication Data

US 2012/0156019 A1 Jun. 21, 2012

(30) Foreign Application Priority Data

Dec. 17, 2010 (CN) .......................... 2010 1 0593936

(51) Int. Cl.
*F04D 29/64* (2006.01)

(52) U.S. Cl.
USPC ....................................... 415/214.1; 361/695

(58) Field of Classification Search
USPC ............ 415/213.1, 214.1, 220; 361/695, 696; 416/244 R
See application file for complete search history.

(56) References Cited

U.S. PATENT DOCUMENTS

| | | | |
|---|---|---|---|
| 7,247,089 B2 * | 7/2007 | Crippen et al. | 454/184 |
| 7,646,601 B2 * | 1/2010 | Zhang et al. | 361/695 |
| 2006/0073783 A1 * | 4/2006 | Tsai et al. | 454/184 |
| 2008/0151490 A1 * | 6/2008 | Fan et al. | 361/687 |
| 2009/0034191 A1 * | 2/2009 | Yin | 361/695 |
| 2009/0059521 A1 * | 3/2009 | Yin | 361/695 |

OTHER PUBLICATIONS

Standard Handbook of Machine Design: Machine Elements That Absorb and Store Energy, Chapter 6: Springs by Robert E. Joerres, 2004, McGraw-Hill. Accessed at: http://engineeringexcellence.files.wordpress.com/2011/10/springs.pdf.*

* cited by examiner

*Primary Examiner* — Nathaniel Wiehe
*Assistant Examiner* — Kayla McCaffrey
(74) *Attorney, Agent, or Firm* — Novak Druce Connolly Bove + Quigg LLP

(57) ABSTRACT

An exemplary embodiment of a fan module includes fan units, and each fan unit includes a box-shaped shell, a guiding plate, and a torsion spring. The box-shaped shell includes a bottom plate and two opposite side walls substantially perpendicular to the bottom plate, and each side wall has a vent defined therein. The guiding plate is rotatable relative to the bottom plate of the shell. The torsion spring includes a first torsion arm, a second torsion arm, and a coil portion. The first torsion arm and the second torsion arm are urged against the bottom plate and the guiding plate respectively by torque force applied from the coil portion. Thereby, the guiding plate is driven to a position adjacent and generally parallel to one of the side walls to obstruct the corresponding vent by the second torsion arm.

19 Claims, 7 Drawing Sheets

FAN MODULE

BACKGROUND

1. Technical Field

The disclosure generally relates to computer hardware technology, and particularly to a fan module for dissipating heat from a computer case.

2. Description of Related Art

A typical computer case needs a number of fans to dissipate heat from the electronic components contained therein. For example, six fans are required for a motherboard with a four-core CPU (central processing unit), and four fans are required for a motherboard with a dual-core CPU. The fans may be joined together in a single fan module. In use, the positions reserved for fans in the fan module may or may not be completely occupied by a full complement of fans. If there is an empty position in the fan module, a guiding plate is usually placed in the empty position, to prevent air from flowing out of the computer case without exchanging heat with the electronic components. Without the guiding plate positioned in the fan module, the heat dissipating efficiency is reduced, and the heat inside the whole computer case may build up. Typically, the guiding plate must be manually set in the fan module to block a vent of the empty position. This type of arrangement for the fans of the fan module is not convenient.

Therefore, there is a desire to provide a fan module that addresses the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the different views, and all the views are schematic.

DETAILED DESCRIPTION

Figure 1:
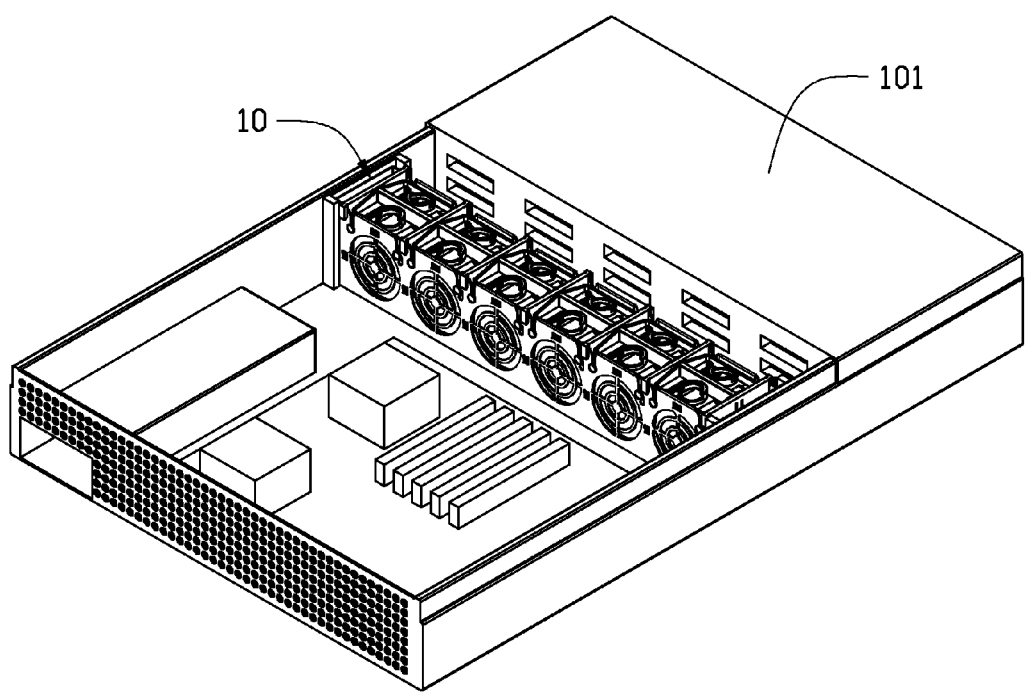
FIG. 1 is an isometric view of an exemplary embodiment of a fan module in accordance with the disclosure, showing the fan module installed in a host computer.
Figure 2:
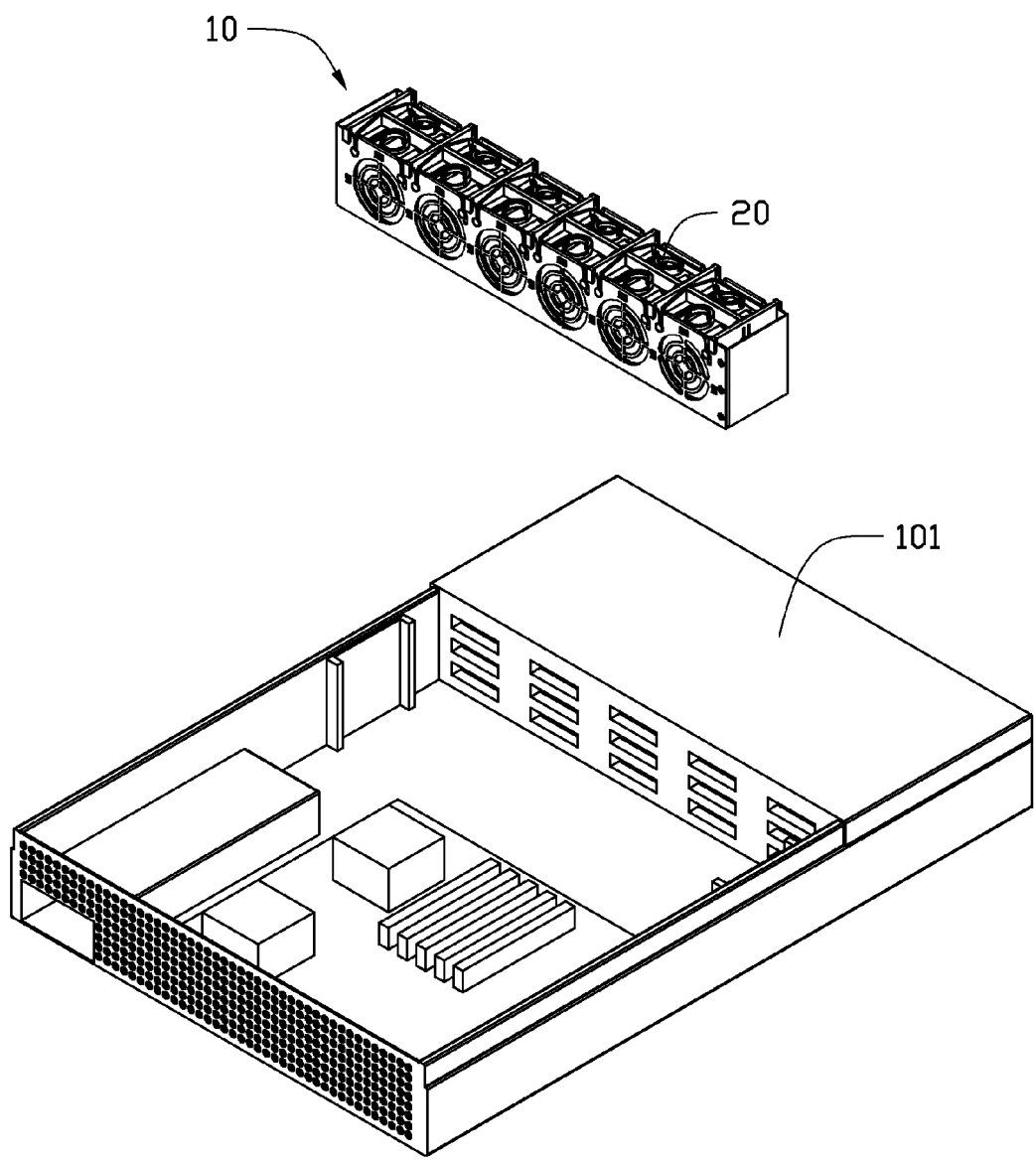
FIG. 2 is similar to FIG. 1, but showing the fan module removed from the host computer.

Referring to FIGS. 1 and 2, a fan module 10 in accordance with an exemplary embodiment of the present disclosure is shown. The fan module 10 is installed in a host computer 101 to dissipate heat of electronic components arranged in the host computer 101. The host computer 101 may for example be a PC (personal computer) or a server. Accordingly, to meet the demands of practical applications, the fan module 10 includes as many as several or more fan units 20 to dissipate heat from various discrete thermal sources. For example, when the amount of heat generated from the discrete thermal sources is great, there may be two, four, or six fan units 20 in the fan module 10. On the other hand, when little heat is generated, there may be only one fan unit 20 in the fan module 10. In other embodiments, a fan module may include even more than six fan units 20.

Figure 3:
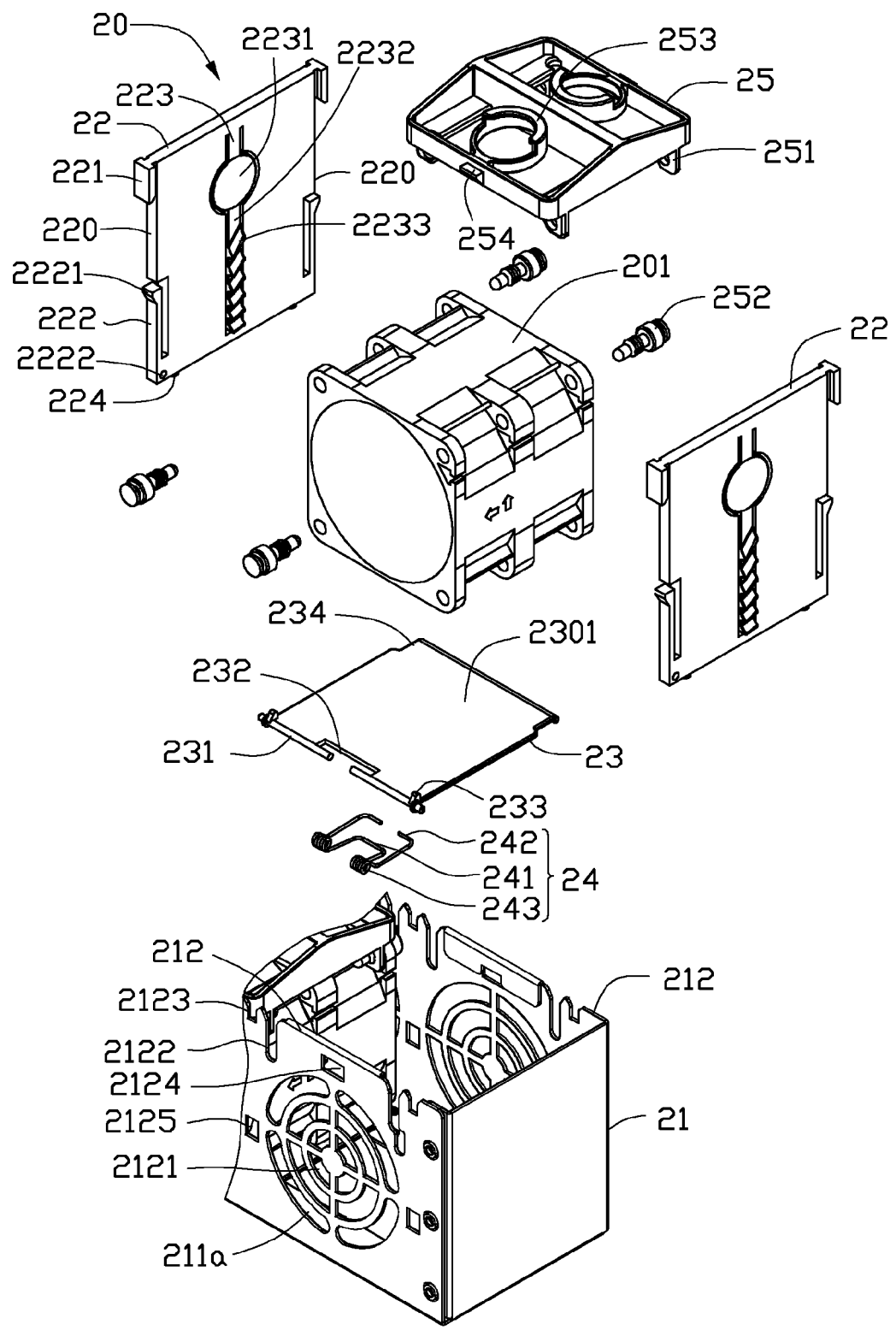
FIG. 3 is an exploded, isometric view of a fan unit of the fan module of FIG. 2, also showing a fan for installation into the fan unit.
Figure 4:
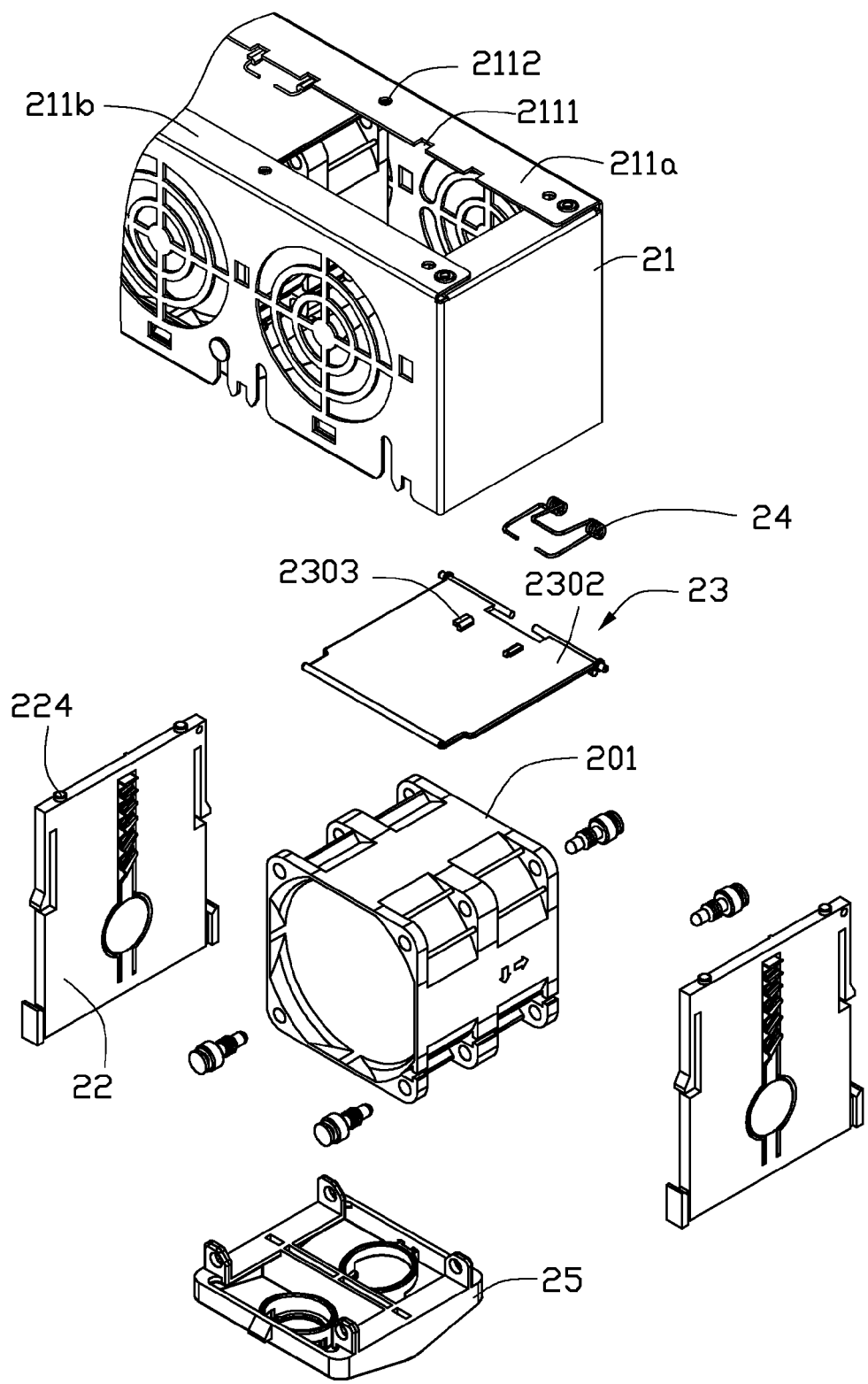
FIG. 4 is an exploded, isometric view of the fan unit of the fan module of FIG. 2 when the fan unit is inverted.

Referring also to FIGS. 3 and 4, each fan unit 20 includes a box-shaped shell 21, a pair of opposite panels 22, a guiding plate 23, a torsion spring 24 and a handle 25. The shell 21 has a first bottom plate portion 211a, a second bottom plate portion 211b, and two opposite side walls 212 perpendicular to the bottom plate portions 211a, 211b. In the present embodiment, the first bottom plate portion 211a has a pair of grooves 2111, and two locating holes 2112 are respectively defined in the first bottom plate portion 211a and the second bottom plate portion 211b. Each side wall 212 has a vent 2121, a pair of guide slots 2122, a pair of cutouts 2123, a first locking hole 2124, and a pair of second locking holes 2125 defined therein. In the illustrated embodiment, the vent 2121 is in the form of a grille or grating. The guide slots 2122 are located at opposite sides of a top of the side wall 212, at opposite sides of a top of the vent 2121. Each guide slot 2122 extends from a top edge of the side wall 212 perpendicularly down toward the corresponding bottom plate portion 211a or 211b. The cutouts 2123 are located at opposite sides of the top of the side wall 212, adjacent to the guide slots 2122. Each cutout 2123 is located at an outer side of the corresponding adjacent guide slot 2122. The first locking hole 2124 is located above a middle of the vent 2121, between the two guide slots 2122. The second locking holes 2125 are located at opposite lateral sides of the vent 2121. Each second locking hole 2125 is between a corresponding one of the bottom plate portions 211a, 211b and a corresponding one of the cutouts 2123.

Each panel 22 includes two opposite sides 220. Each side 220 includes a first buckle 221 at a top thereof, and an elastic arm 222 at a lower portion thereof close to the corresponding bottom plate portion 211a or 211b. The first buckle 221 is oriented perpendicular to the bottom plate portions 211a, 211b, and is engaged in a corresponding cutout 2123 of a corresponding side wall 212. The elastic arm 222 has a first projection 2221 on a top end thereof. A through hole 2222 is defined in bottom corner of one of the sides 220, such side 220 corresponding to the first bottom plate portion 211a. The through hole 2222 is located below the corresponding elastic arm 222. The first buckle 221 is inserted into the corresponding cutout 2123 of the corresponding side wall 212, and the first projection 2221 is snappingly locked into a corresponding second locking hole 2125 of the side wall 212, in order to fix the panel 22 in the shell 21. In alternative embodiments, there may be only one panel 22, with the pair of first buckles 221 and the pair of elastic arms 222 provided thereon.

An adjustment piece 223 is defined in the panel 22, being located midway between the two sides 220 of the panel 22. In the present embodiment, the adjustment piece 223 is in the form of an elongate adjustment arm. The adjustment piece 223 includes a pressing portion 2231 and a locking portion 2232 below and connected with the pressing portion 2231. The adjustment piece 223 is oriented perpendicularly to the bottom plate portions 211a, 211b, and is elastically deformable. A top of the adjustment piece 223 at the pressing portion 2231 extends substantially coplanarly from a main body of the panel 22, and a bottom end of the adjustment piece 223 at the locking portion 2232 is a free end. The pressing portion 2231 has a bulge on each of two opposite sides thereof. Each bulge protrudes out relative to a corresponding one of two main faces at two opposite sides of the main body of the panel 22. The pressing portion 2231 can be pressed horizontally in each of an outward direction and an inward direction, such that the locking portion 2232 moves in the outward direction or the inward direction. Such pressing can be manual pressing by a user's finger, or interference pressing when a fan 201 is installed in the fan unit 20 (see below).

The locking portion 2232 has a number of second projections 2233 provided on each of an inner side and an outer side thereof. In the present embodiment, each second projection 2233 is essentially in the form of a triangular prism. Each second projection 2233 is oriented obliquely relative to the bottom plate portions 211a, 211b, except for a bottommost one of the second projections 2233 that is parallel to the bottom plate portions 211a, 211b. The angles of the second projections 2233 relative to the bottom plate 211 gradually increase from the bottommost second projection 2233 to a topmost one of the second projections 2233. The series of second projections 2233 on the inner side of the locking portion 2232 and the series of second projections 2233 on the outer side of the locking portion 2232 are mirror images of each other.

In addition, two locating pins 224 are defined on a bottom edge of the panel 22, between the two sides 220 of the panel 22. The locating pins 224 are engaged in two corresponding locating holes 2112 of the first and second bottom plate portions 211a, 211b, in order to fix the panel 22 in the shell 21.

The guiding plate 23 has a first surface 2301 generally facing away from the first and second bottom plate portions 211a, 211b to be in contact with one fan 201 assembled in the shell 21, and a second surface 2302 which has a pair of positioning blocks 2303 provided thereon. One end of the guiding plate 23 located at the first bottom plate portion 211a is referred to herein as an axle end of the guiding plate 23, and an opposite end of the guiding plate 23 is referred to herein as a free end of the guiding plate 23. The positioning blocks 2303 are close to the axle end of the guiding plate 23. The axle end of the guiding plate 23 has two opposing elongated cylindrical connecting rods 231, a receiving groove 232 located between the two connecting rods 231, and two limiting blocks 233 respectively located at ends of the connecting rods 231 that are farthest from each other. The two connecting rods 231 are coaxial, and extend in directions parallel to a main body of the guiding plate 23. The ends of the connecting rods 231 are inserted into the through holes 2222 of the two panels 22, respectively, such that the connecting rods 231 can rotate about their common axis. Thus the guiding plate 23 can rotate about the axis of the connecting rods 231.

A pair of recesses 234 are respectively defined in opposite sides of the free end of the guiding plate 23. That is, the recesses 234 are defined in two corners of the guiding plate 23, respectively. In addition, once the guiding plate 23 is assembled on the shell 21 in this way and is oriented at an angle where the free end of the guiding plate 23 is between the pressing portions 2231 of the panels 22, the recesses 234 of the guiding plate 23 correspond to the pressing portions 2231. Thus, the bulges of the pressing portions 2231 do not interfere with the free end of the guiding plate 23, allowing the guiding plate 23 to freely rotate to any desired position in the shell 21. In the present embodiment, the width of the guiding plate 23 is slightly less than the distance between the two panels 22.

The torsion spring 24 includes a U-shaped first torsion arm 241, a pair of second torsion arms 242, and a pair of coaxial coil portions 243. Each coil portion 243 connects one end of the first torsion arm 241 and one of the second torsion arms 242. The two coil portions 243 are respectively coiled around the connecting rods 231, and are simultaneously located in the receiving groove 232 of the guiding plate 23 and the grooves 2111 of the first bottom plate portion 211a. The torsion spring 24 can supply durable elasticity, so that the first torsion arm 241 is urged and held to the bottom plate 211 by torque force applied from the coil portions 243. The second torsion arms 242 are urged and held to the guiding plate 23 by the torque force applied from the coil portions 243, and are locked in position by the positioning blocks 2303. When the free end of the guiding plate 23 is located close to one side wall 212 of the shell 21, the coil portions 243 apply some torque force and press the guiding plate 23 toward the side wall 212. This ensures that the guiding plate 23 is maintained in a substantially vertical position, obstructing the corresponding vent 2121. The condition of the free end of the guiding plate 23 being pressed close to the side wall 212 of the shell 21 can be defined as an initial position of the guiding plate 23. In other embodiments, the guiding plate 23 can be assembled in the shell 21 by other means, as long as the torsion spring 24 applies durable elastic urging force to the guiding plate 23 and the first bottom plate portion 211a.

When the fan unit 20 does not include the fan 201 assembled therein, the fan unit 20 is said to be "empty." In this state, the free end of the guiding plate 23 is pressed close to the side wall 212 of the shell 21 by the elastic urging of the torsion spring 24, and the guiding plate 23 is in the initial position obstructing the vent 2121. In this position, the limiting blocks 233 of the connecting rod 231 directly abut the side wall 212, and thereby a gap is maintained between the free end of the guiding plate 23 and the side wall 212. Because of the elastic urging of the torsion spring 24, the guiding plate 23 is automatically maintained in the initial position blocking the vent 2121 of the fan unit 20 when there is no fan 201 installed in the fan unit 20. This ensures that airflow exiting the host computer 101 via the empty fan unit 20 is substantially reduced. This enables more efficient utilization of cooling airflow within the host computer 101, and thereby improves the heat-dissipating efficiency of the host computer 101. The gap between the free end of the guiding plate 23 and the side wall 212 allows the user to conveniently press the guiding plate 23 when the user wants to reposition the guiding plate 23.

In the present embodiment, the guiding plate 23 is located inside the shell 21 at all times. Therefore the guiding plate 23 does not take up space around the peripheral area of the fan unit 20, and is not an extra element that needs to be added to the fan unit 20. Thereby, the utility of the fan module 10 is improved. Moreover, because the guiding plate 23 at the initial position is pressed close to the side wall 212 of the shell 21 by the elastic urging of the torsion spring 24, the guiding plate 23 remains in position even when the fan unit 20 is inverted.

Figure 5:
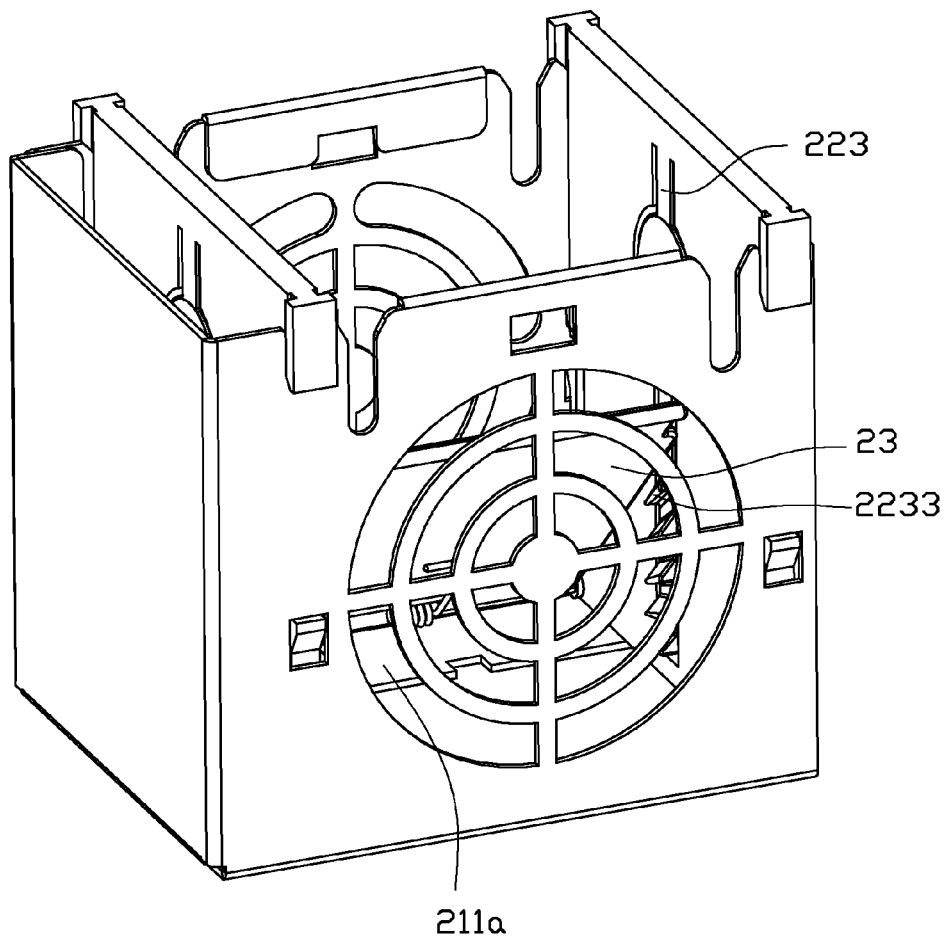
FIG. 5 is essentially an enlarged, isometric, assembled view of the fan unit of FIG. 3, showing a guiding plate of the fan unit positioned at a desired oblique angle, and omitting a handle of the fan unit.

Furthermore, the locking portions 2232 of the adjustment pieces 223 of the two panels 22 of the fan unit 20 are available for repositioning the guiding plate 23 to any of various selectable alternative locations. That is, the free end of the guiding plate 23 can be locked by any selected pair of second projections 2233 to thereby maintain a predetermined angle relative to the bottom plate portions 211a, 211b. All such angles are oblique angles, except when the free end of the guiding plate 23 is locked by the bottommost pair of second projections 2233. When the free end of the guiding plate 23 is locked by the bottommost pair of second projections 2233, the guiding plate 23 is substantially parallel to the bottom plate portions 211a, 211b. Thereby, a desired gap can be formed between the free end of the guiding plate 23 and the corresponding side wall 212 opposite thereto, to adjust the quantity of ventilation associated with the fan unit 20. Referring to FIG. 5, the guiding plate 23 is held in position by the adjustment pieces 223, and maintains a desired oblique angle relative to the bottom plate portions 211a, 211b. Therefore, the ventilation associated with the fan unit 20 is adjusted appropriately, and the heat-dissipating distribution for the host computer 101 can be optimized.

Furthermore, with the above-described configurations of each panel 22 of each fan unit 20, each two adjacent fan units 20 share a common panel 22 therebetween. This helps save costs.

The handle 25 has a square profile, and holds and fixes the fan 201 in position in the shell 21. The handle 25 includes at least two lugs 251 depending from a bottom thereof. In the illustrated embodiment, there are four lugs 251. The handle 25 also has at least two fixing pieces 252 coordinating with the lugs 251 respectively, and two opposing pull tabs 253. In the illustrated embodiment, there are four fixing pieces 252. Each lug 251 has a through hole defined therein. The fixing pieces 252 can be screws. The pull tabs 253 are located at a middle of the handle 25. Each pull tab 253 has an extensible second buckle 254 extending outwards. The handle 25 can be fixed on the fan 201, with a tail end of each fixing piece 252 extending through one lug 251 and engaging in an ear of the fan 201, and a head end of the fixing piece 252 being locked in one guide slot 2122 of the corresponding side wall 212. The combined fan 201 and handle 25 can be fixed in the shell 21, with the second buckles 254 of the pull tabs 253 being respectively inserted into the first locking holes 2124 of the side walls 212. Alternatively, the fan 201 can be combined with the handle 25 by other means, such as elastic clips directly placed on the handle 25 to hold the fan 201.

Figure 6:
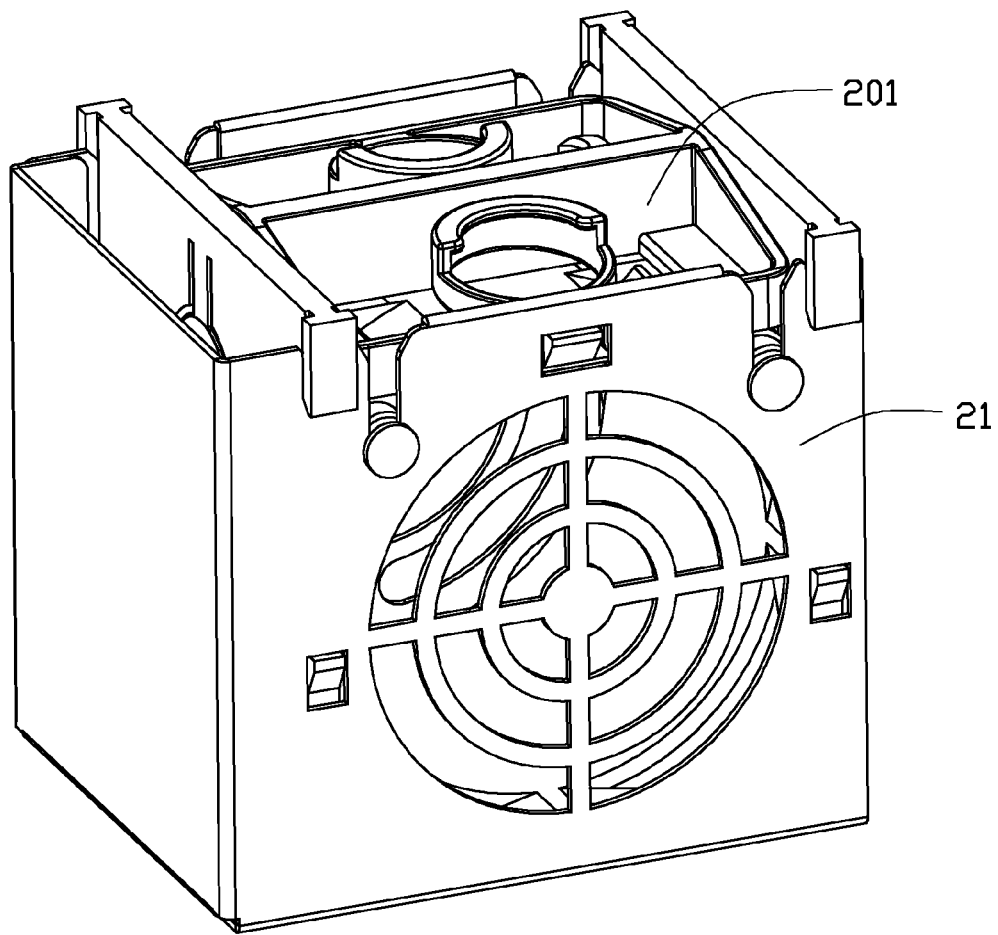
FIG. 6 is essentially an enlarged, isometric, assembled view of the fan unit of FIG. 3, showing the fan installed in the fan unit, but omitting a core of the fan.

The method for assembling the fan 201 to the fan unit 20 is described in more detail below. First, the handle 25 is fixed on the fan 201 with the fixing pieces 252. Pressure is applied to the free end of the guiding plate 23 to rotate the guiding plate 23 until the guiding plate 23 reaches a position where it is engaged by a pair of the second projections 2233. Typically, the pair of second projections 2233 is other than the bottommost pair of second projections 2233, and the position reached by the guiding plate 23 is an oblique position. The combined fan 201 and handle 25 is lowered vertically into the shell 21 (along the extending direction of the guide slots 2122). In this process, because the pressing portions 2231 have the bulges which protrude relative to the main bodies of the panels 22, the pressing portions 2231 are pushed outwardly by outer walls of the fan 21, thereby releasing the guiding plate 23 from the second projections 2233. As the combined fan 201 and handle 25 travels further down, the fan 201 pushes the free end of the guiding plate 23 down, the head ends of the fixing pieces 252 slide down along the guide slots 2122 of the side walls 212, and the pull tabs 253 are pressed toward each other by the user's fingers. Then the head ends of the fixing pieces 252 reach the bottoms of the guide slots 2122, and the pull tabs 253 are released by the user so that the second buckles 254 are engaged in the corresponding first locking holes 2124 of the side walls 212. At this time, the guiding plate 23 is engaged below the bottommost pair of second projections 2233. Thus, the fan 201 is fixed in the shell 21, as schematically shown in FIG. 6.

Figure 7:
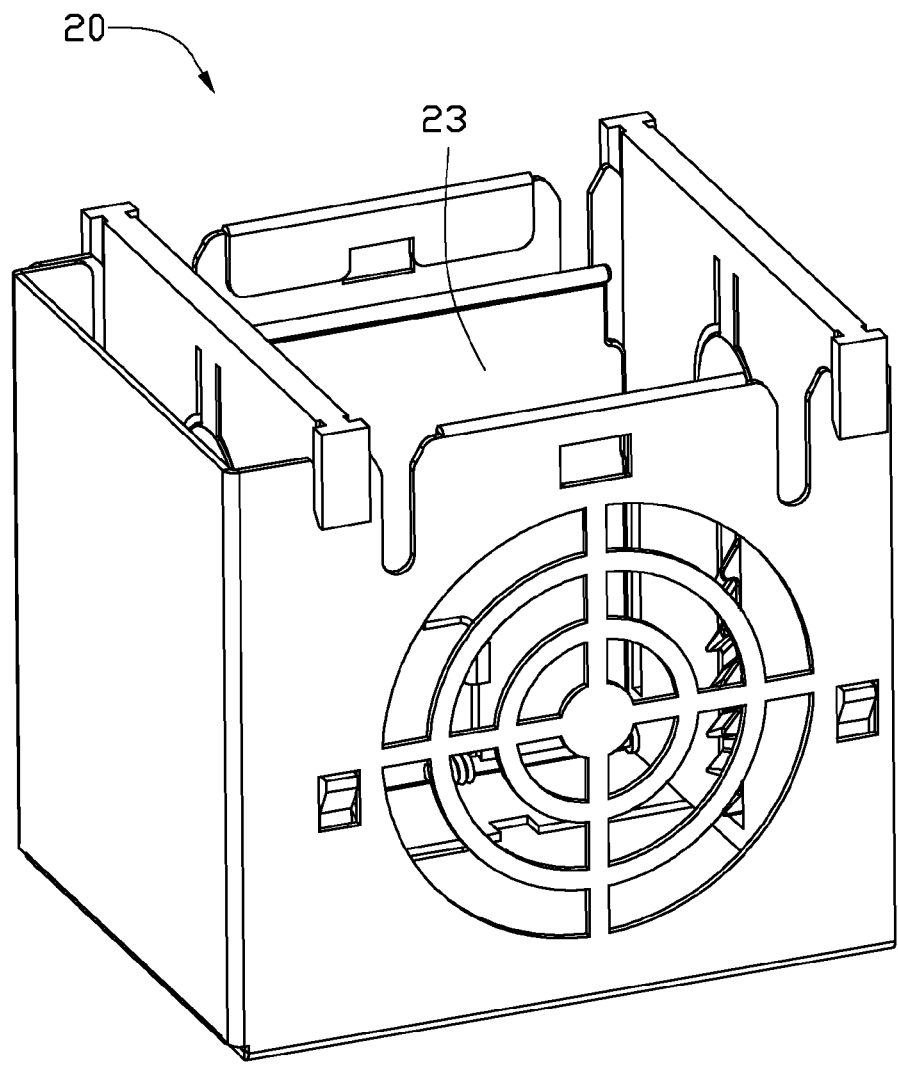
FIG. 7 is similar to FIG. 5, but showing the guiding plate positioned vertically.

A method for disassembling the fan 201 from the fan unit 20 is described below. First, the pull tabs 253 are pressed toward each other until the second projections 254 of the pull tabs 253 disengage from the first locking holes 2124 of the side walls 212. The handle 25 is pulled up so that the combined fan 201 and handle 25 is raised vertically. In this process, the outer walls of the fan 21 push the pressing portions 2231 outwardly. Thereby, the guiding plate 23 is released from the bottommost second projections 2232, and the torsion spring 24 urges the guiding plate 23 to rotate upwardly. As the combined fan 201 and handle 25 travels further up, the guiding plate 23 correspondingly rotates up. Finally, the combined fan 201 and handle 25 reaches a position completely free of the shell 21, and the guiding plate 23 rotates all the way back to the initial position for blocking the vent 2121 of the fan unit 20. Thus, the fan 201 is taken out of the shell 21, as shown in FIG. 7.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope and spirit of the appended claims.

What is claimed is:

1. A fan module comprising:
   at least one fan unit, the at least one fan unit comprising:
   a box-shaped shell comprising a bottom plate and two opposite side walls substantially perpendicular to the bottom plate, each side wall having a vent defined therein;
   a guiding plate rotatable relative to the bottom plate of the shell; and
   a torsion spring comprising a first torsion arm, a second torsion arm, and a coil portion connecting one end of the first torsion arm and one end of the second torsion arm, the first torsion arm and the second torsion arm being urged against the bottom plate and the guiding plate respectively by torque force applied from the coil portion, and the guiding plate thereby driven to a position adjacent and generally parallel to one of the side walls to obstruct the corresponding vent by the second torsion arm; and
   a pair of opposite panels fixed in the shell, wherein a bottom corner of each panel has a through hole defined therein; the guiding plate has a free end and a second end opposite to the free end, the second end of the guiding plate comprises two opposing elongated cylindrical connecting rods, the two connecting rods are coaxial and extend in directions parallel to a main body of the guiding plate, and ends of connecting rods farthest from each other are inserted into the through holes of the two panels, respectively, such that the second end of the guiding plate is pivotably connected with the bottom plate of the shell.

2. The fan module of claim 1, wherein the second end of the guiding plate has at least one limiting block located on at least one of the connecting rods, and the at least one limiting block is configured for directly abutting said one of the side walls of the shell and thereby maintaining a gap between the free end of the guiding plate and said one of the side walls.

3. The fan module of claim 1, wherein the bottom plate of the shell has a groove defined therein, the guiding plate has a receiving groove located between the two connecting rods, and the coil portion is coiled around the connecting rods and is simultaneously located in the receiving groove of the guiding plate and the groove of the bottom plate.

4. The fan module of claim 1, wherein the guiding plate has a first surface facing generally away from the bottom plate of the shell, and a second surface which has a positioning block provided thereon, the positioning block is close to the second end of the guiding plate and the second torsion arm is locked in position on the guiding plate by the positioning block.

5. The fan module of claim 1, wherein each panel comprises two opposite sides, each side of the panel has an elastic arm at a lower portion thereof close to the bottom plate of the shell, each elastic arm has a first projection on a top end thereof, each side wall of the shell has a pair of second locking holes defined therein, and the first projection of the side of the panel is snappingly locked into a corresponding second locking hole of a corresponding side wall.

6. The fan module of claim 5, wherein a bottom edge of each panel has at least one locating pin defined thereon, the bottom plate of the shell has at least two locating holes defined therein, and the locating pins of the panels are engaged in the locating holes of the bottom plate respectively to fix the panels in the shell.

7. The fan module of claim 1, wherein each panel comprises two opposite sides, each side of the panel comprises a first buckle at a top thereof, the first buckle is oriented perpendicular to the bottom plate, each side wall has a pair of cutouts defined therein, the cutouts located at opposite sides of a top of the side wall, and the first buckle is engaged in a corresponding cutout of a corresponding side wall.

8. The fan module of claim 1, wherein each panel comprises two opposite sides and an adjustment piece located between the two sides, the adjustment piece comprises a pressing portion and a locking portion below and connected with the pressing portion, the adjustment piece is oriented perpendicular to the bottom plate, a top of the adjustment piece at the pressing portion extends substantially coplanarly from a main body of the panel, a bottom end of the adjustment piece at the locking portion is a free end, the pressing portion has a bulge on each of two opposite sides thereof, each bulge protrudes out relative to a corresponding one of two main faces at two opposite sides of the main body of the panel, the pressing portion is pressable horizontally in each of an outward direction and an inward direction, and the locking portion is configured for holding the guiding plate in a desired position relative to the bottom plate of the shell.

9. The fan module of claim 8, wherein the locking portion has a plurality of second projections provided on each of an inner side and an outer side thereof; and at each of the inner side and the outer side of the locking portion, each second projection is essentially in the form of a triangular prism, and each second projection is oriented obliquely relative to the bottom plate of the shell except for a bottommost one of the second projections that is generally parallel to the bottom plate.

10. The fan module of claim 8, wherein the guiding plate has a free end and a second end opposite to the free end, the free end of the guiding plate has a pair of recesses respectively defined in opposite sides thereof, the recesses respectively corresponding to the pressing portions of the adjustment pieces of the panels, the second end of the guiding plate is pivotably connected with the bottom plate of the shell.

11. The fan module of claim 1, further comprising at least one fan, and at least one handle for holding and fixing the at least one fan in position in the shell of the at least one fan unit, wherein the at least one handle comprises two opposing pull tabs located at a middle thereof, each pull tab has an extensible second buckle extending outwards, each of the side walls of the shell has a first locking hole defined therein above the vent, and the second buckles of the two pull tabs are respectively inserted into the first locking holes of the side walls to fix the at least one fan in the shell.

12. The fan module of claim 11, wherein the at least one fan comprises at least two ears, the at least one handle further comprises at least two lugs depending from a bottom thereof, and at least two fixing pieces, each side wall of the shell comprises at least one guide slot located at the at least one of two opposite sides of a top thereof, each guide slot extends from a top edge of the side wall perpendicularly down toward the bottom plate, a tail end of each fixing piece extends through a corresponding one of the lugs and is engaged in a corresponding one of the ears of the fan, a head end of the fixing piece is locked in one guide slot of the corresponding side wall, and thereby the at least one handle is fixed on the at least one fan.

13. A fan module comprising:
at least one fan unit, the at least one fan unit comprising:
a box-shaped shell comprising a bottom plate and two opposite side walls substantially perpendicular to the bottom plate, each of the side walls having a vent defined therein;
a guiding plate rotatably received in the shell, an end of the guiding plate pivotably connected to the shell in the vicinity of junctions of the bottom plate and each of the side walls; and
a spring positioned between the guiding plate and the bottom plate of the shell, the spring elastically urging the bottom plate and the guiding plate, respectively, and the guiding plate thereby driven to a position adjacent to the one of the side walls to obstruct the vent of the one of the side walls; and
a pair of opposite panels fixed in the shell, wherein a bottom corner of each panel has a through hole defined therein; the guiding plate has a free end and a second end opposite to the free end, the second end of the guiding plate comprises two opposing elongated cylindrical connecting rods, the two connecting rods are coaxial and extend in directions parallel to a main body of the guiding plate, and ends of connecting rods farthest from each other are inserted into the through holes of the two panels, respectively, such that the second end of the guiding plate is pivitably connected with the bottom plate of the shell.

14. The fan module of claim 13, wherein the second end of the guiding plate has at least one limiting block located on at least one of the connecting rods, and the at least one limiting block is configured for directly abutting said one of the side walls of the shell and thereby maintaining a gap between the free end of the guiding plate and said one of the side walls.

15. The fan module of claim 13, wherein each panel comprises two opposite sides, each side of the panel has an elastic arm at a lower portion thereof close to the bottom plate of the shell, each elastic arm has a first projection on a top end thereof, each side wall of the shell has a pair of second locking holes defined therein, and the first projection of the side of the panel is snappingly locked into a corresponding second locking hole of a corresponding side wall.

16. The fan module of claim 13, wherein each panel comprises two opposite sides and an adjustment piece located between the two sides, the adjustment piece comprises a pressing portion and a locking portion below and connected with the pressing portion, the adjustment piece is oriented perpendicular to the bottom plate, a top of the adjustment piece at the pressing portion extends substantially coplanarly from a main body of the panel, a bottom end of the adjustment piece at the locking portion is a free end, the pressing portion has a bulge on each of two opposite sides thereof, each bulge protrudes out relative to a corresponding one of two main faces at two opposite sides of the main body of the panel, the pressing portion is pressable horizontally in each of an outward direction and an inward direction, and the locking portion is configured for holding the guiding plate in a desired position relative to the bottom plate of the shell.

17. The fan module of claim 16, wherein the locking portion has a plurality of second projections provided on each of an inner side and an outer side thereof; and at each of the inner side and the outer side of the locking portion, each second projection is essentially in the form of a triangular prism, and each second projection is oriented obliquely relative to the bottom plate of the shell except for a bottommost one of the second projections that is generally parallel to the bottom plate.

18. The fan module of claim 16, wherein the guiding plate has a free end and a second end opposite to the free end, the free end of the guiding plate has a pair of recesses respectively defined in opposite sides thereof, the recesses respectively corresponding to the pressing portions of the adjustment pieces of the panels, the second end of the guiding plate is pivotably connected with the bottom plate of the shell.

19. A fan module comprising:
   at least one fan unit, the at least one fan unit comprising:
      a box-shaped shell comprising a bottom plate and two opposite side walls substantially perpendicular to the bottom plate, each side wall having a vent defined therein;
      a guiding plate rotatable relative to the bottom plate of the shell;
      a torsion spring comprising a first torsion arm, a second torsion arm, and a coil portion connecting one end of the first torsion arm and one end of the second torsion arm, the first torsion arm and the second torsion arm being urged against the bottom plate and the guiding plate respectively by torque force applied from the coil portion, and the guiding plate thereby driven to a position adjacent and generally parallel to one of the side walls to obstruct the corresponding vent by the second torsion arm; and
   at least one fan, and at least one handle for holding and fixing the at least one fan in position in the shell of the at least one fan unit, wherein the at least one handle comprises two opposing pull tabs located at a middle thereof, each pull tab has an extensible second buckle extending outwards, each of the side walls of the shell has a first locking hole defined therein above the vent, and the second buckles of the two pull tabs are respectively inserted into the first locking holes of the side walls to fix the at least one fan in the shell.

* * * * *